(12) United States Patent
Wang et al.

(10) Patent No.: US 9,726,436 B2
(45) Date of Patent: Aug. 8, 2017

(54) VAPOR CHAMBER HAVING NO GAS DISCHARGING PROTRUSION AND MANUFACTURING METHOD THEREOF

(71) Applicant: CHAUN-CHOUNG TECHNOLOGY CORP., New Taipei (TW)

(72) Inventors: Shih-Ming Wang, New Taipei (TW); Pang-Hung Liao, New Taipei (TW); Cheng-Tu Wang, New Taipei (TW)

(73) Assignee: CHAUN-CHOUNG TECHNOLOGY CORP., New Taipei (TW)

( * ) Notice: Subject to any disclaimer, the term of this patent is extended or adjusted under 35 U.S.C. 154(b) by 176 days.

(21) Appl. No.: 14/805,098

(22) Filed: Jul. 21, 2015

(65) Prior Publication Data

US 2017/0023307 A1 Jan. 26, 2017

(51) Int. Cl.
  *F28D 15/00* (2006.01)
  *F28D 15/04* (2006.01)
  *B23P 15/26* (2006.01)
  *H01L 23/427* (2006.01)
  *H01L 21/48* (2006.01)

(52) U.S. Cl.
  CPC .......... *F28D 15/04* (2013.01); *B23P 15/26* (2013.01); *B23P 2700/09* (2013.01); *H01L 21/4882* (2013.01); *H01L 23/427* (2013.01)

(58) Field of Classification Search
  CPC ...... F28D 15/04; B23P 15/26; B23P 2700/09; H01L 21/4882; H01L 23/427

USPC ................................................... 165/104.26
See application file for complete search history.

(56) References Cited

U.S. PATENT DOCUMENTS

| 6,013,130 A * | 1/2000 | Dieter | C30B 23/02 117/91 |
| 2008/0152547 A1* | 6/2008 | Hopke | B01D 47/05 422/109 |
| 2009/0262500 A1* | 10/2009 | Makino | H01L 23/4735 361/697 |
| 2012/0094014 A1* | 4/2012 | Ono | C23C 14/12 427/66 |

* cited by examiner

*Primary Examiner* — Davis Hwu
(74) *Attorney, Agent, or Firm* — Chun-Ming Shih; HDLS IPR Services

(57) ABSTRACT

A vapor chamber having no gas discharging protrusion includes: a lower shell member, formed with an upper surface divided into an inner zone and an outer zone and an outer peripheral wall formed with a planar surface, the inner zone is formed with capillary channels, the outer zone is formed with a recess, and one thereof is communicated with at least one of the capillary channels and the other end thereof penetrates the planar surface; and an upper shell member, engaged with the upper surface and sealed with the lower shell member, and a gas discharging hole is formed between the recess and the upper shell member. Accordingly, a conventional gas discharging protrusion is not required on the vapor chamber thereby advantages of small and thin in volume and compact in structure being provided.

15 Claims, 9 Drawing Sheets

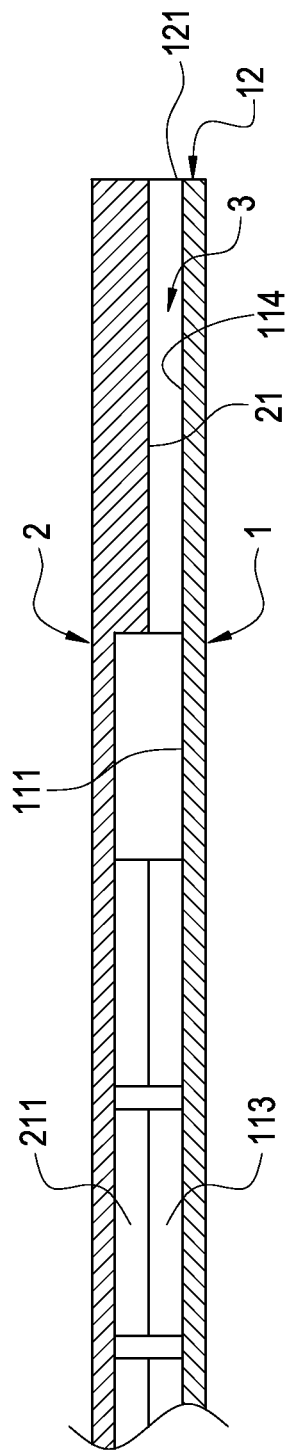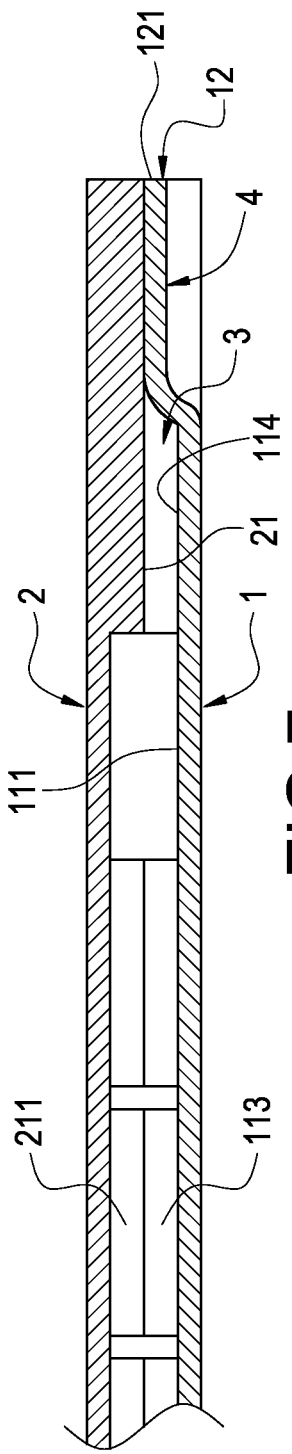

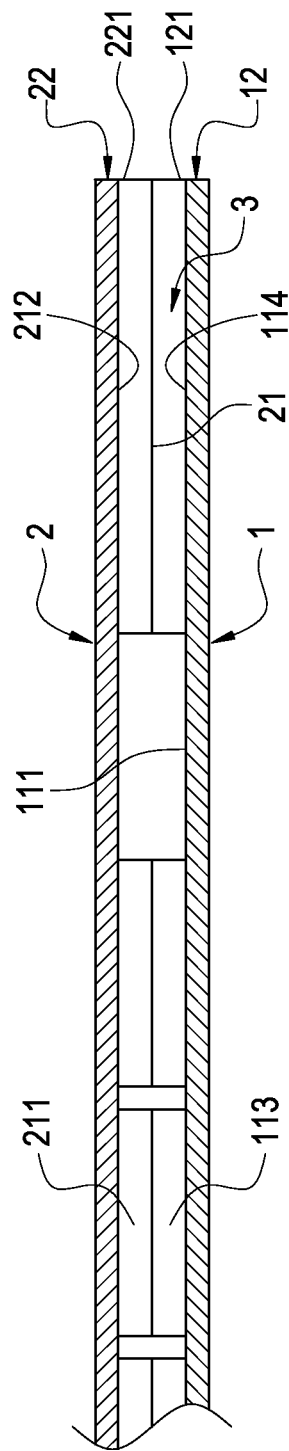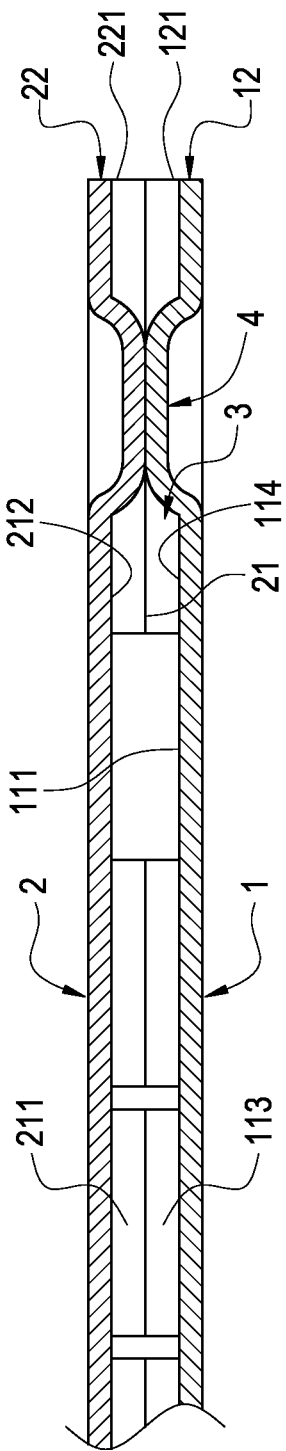

VAPOR CHAMBER HAVING NO GAS DISCHARGING PROTRUSION AND MANUFACTURING METHOD THEREOF

BACKGROUND OF THE INVENTION

Field of the Invention

The present invention relates to a vapor chamber, especially to a vapor chamber having no gas discharging protrusion and a manufacturing method thereof.

Description of Related Art

The function and working principle of a vapor chamber are the same as the function and working principle of a heat pipe; a working fluid sealed in a plate-like chamber is repeatedly vaporized and condensed for allowing thermal energy of a heat negating component to be rapidly absorbed by the vapor chamber, so the vapor chamber is provided with a function of allowing the thermal energy to be rapidly transferred and diffused.

However, during the manufacturing procedures of a vapor chamber, a working fluid filling operation and a vacuuming operation are required, so when a shell body of the vapor chamber is manufactured, a gas discharging protrusion is outwardly formed in the shell body of the vapor chamber for allowing the working fluid operation and the vacuuming operation to be smoothly processed. But, with the trend of the vapor chamber being smaller and thinner, the gas discharging protrusion at the outer side of the vapor chamber is an obstacle for enabling the volume of the vapor chamber to be smaller and the structure of the vapor chamber to be simplified.

In view of the above-mentioned disadvantages, the applicant of the present invention has devoted himself for researching and inventing a novel design for improving the above-mentioned disadvantages.

SUMMARY OF THE INVENTION

The present invention is to provide a vapor chamber having no gas discharging protrusion and a manufacturing method thereof, in which a recess is formed on a lower shell member, one end of the recess is communicated with at least one of a plurality of capillary channels communicated with each other and the other end penetrates a planar surface, and a gas discharging hole is formed between the recess and an upper shell member, so a conventional gas discharging protrusion is not required to be formed on the vapor chamber, thereby allowing the vapor chamber of the present invention to be provided with advantages of small and thin in volume and compact in structure.

Accordingly, the present invention provides a vapor chamber having no gas discharging protrusion, which includes a lower shell member, formed with an upper surface and an outer peripheral wall, wherein the outer peripheral wall is formed with a planar surface, the upper surface is divided into an inner zone and an outer zone annularly arranged at the outer periphery of the inner zone, the inner zone is formed with a plurality of capillary channels communicated with each other, the outer zone is formed with a recess, and one end of the recess is communicated with at least one of the capillary channels and the other end thereof penetrates the planar surface; and an upper shell member, correspondingly engaged with the upper surface and mutually sealed with the lower shell member, wherein a gas discharging hole is formed between the recess and the upper shell member.

Accordingly, the present invention provides a manufacturing method of a vapor chamber having no gas discharging protrusion, which includes the steps of: step a) preparing a lower shell member, wherein the lower shell member is formed with an upper surface and an outer peripheral wall, the outer peripheral wall is formed with a planar surface, the upper surface is divided into an inner zone and an outer zone annularly arranged at the outer periphery of the inner zone, and the inner zone is formed with a plurality of capillary channels communicated with each other; step b) forming a recess in the outer zone, wherein one end of the recess is communicated with at least one of the capillary channels and the other end thereof penetrates the planar surface; step c) preparing an upper shell member, wherein the upper shell member is correspondingly engaged with the upper surface, and an engaging and sealing operation is processed to the edge of the lower shell member and the edge of the upper shell member, thereby allowing a gas discharging hole to be formed between the recess and the upper shell member; step d) preparing a working fluid, wherein the working fluid is filled in the capillary channels through the gas discharging hole and a vacuuming operation is processed; and step e) processing a sealing operation to the gas discharging hole.

BRIEF DESCRIPTION OF DRAWING

FIG. 6 is a cross sectional view showing a gas discharging hole being formed between a recess and the upper shell member according to one preferred embodiment of the present invention;

FIG. 7 is a cross sectional view showing the lower shell member being pressed towards the recess for being welded so as to form a sealed part according to one preferred embodiment of the present invention;

FIG. 10 is a cross sectional view showing the vapor chamber according another preferred embodiment of the present invention; and FIG. 11 is another cross sectional view showing the vapor chamber according another preferred embodiment of the present invention.

DETAILED DESCRIPTION OF THE INVENTION

Preferred embodiments of the present invention will be described with reference to the drawings.

Please refer from FIG. 1 to FIG. 7, the present invention provides a vapor chamber having no gas discharging protrusion and a manufacturing method thereof. The vapor chamber 10 mainly includes a lower shell member 1 and an upper shell member 2.

Figure 1:
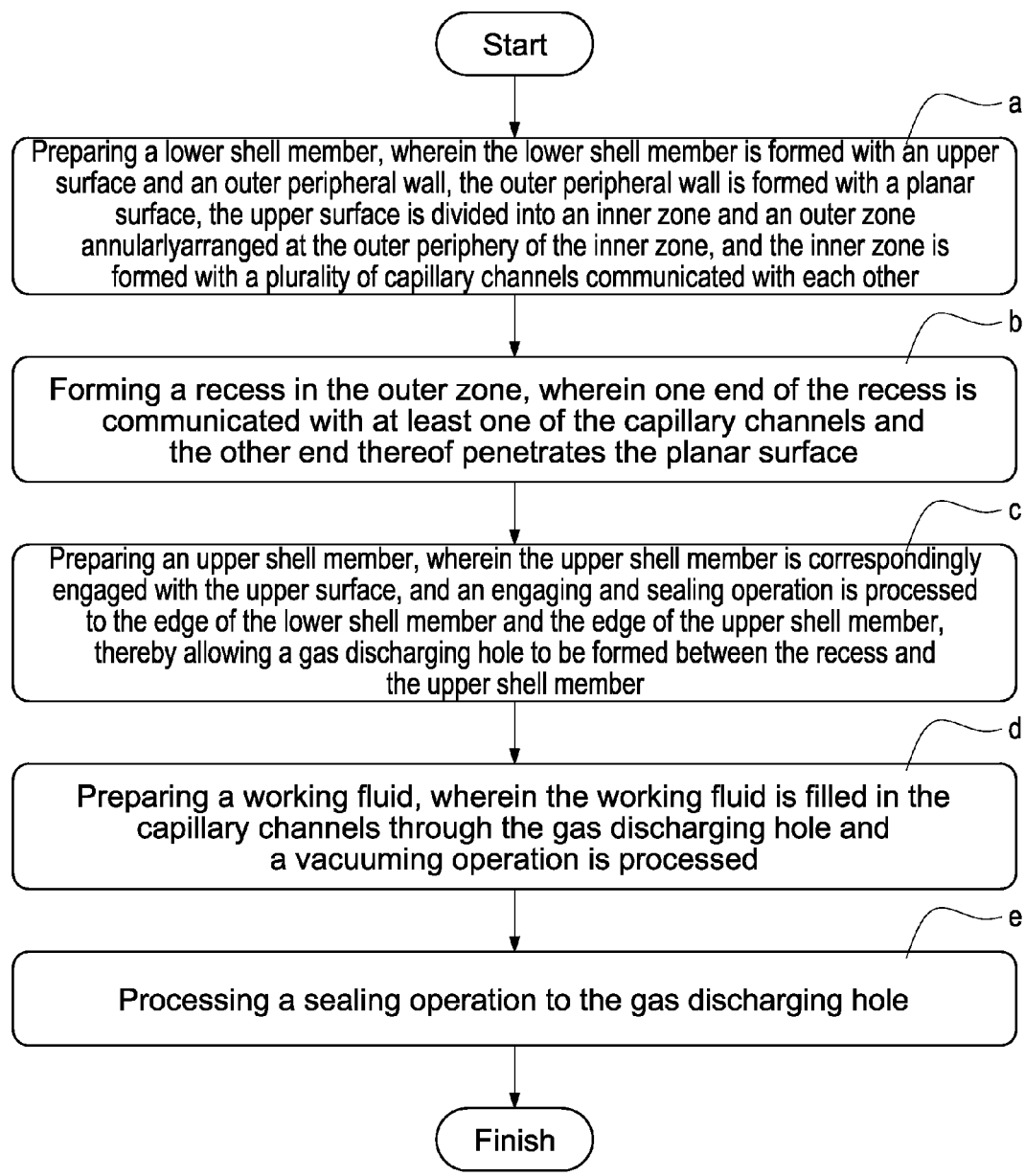
FIG. 1 is a flowchart showing a manufacturing method of a vapor chamber according to one preferred embodiment of the present invention.

Please refer to FIG. 1, which is a flowchart showing the manufacturing method of the vapor chamber 10 according to one preferred embodiment of the present invention. As shown as a step a) disclosed in FIG. 1 and as shown in FIG. 2, the first step is to prepare a lower shell member 1, the lower shell member 1 is formed with an upper surface 11 and an outer peripheral wall 12, the outer peripheral wall 12 is formed with a planar surface 121, the upper surface 11 is divided into an inner zone 111 and an outer zone 112 annularly arranged at the outer periphery of the inner zone 111, and the inner zone 111 is formed with a plurality of capillary channels 113 communicated with each other.

Figure 2:
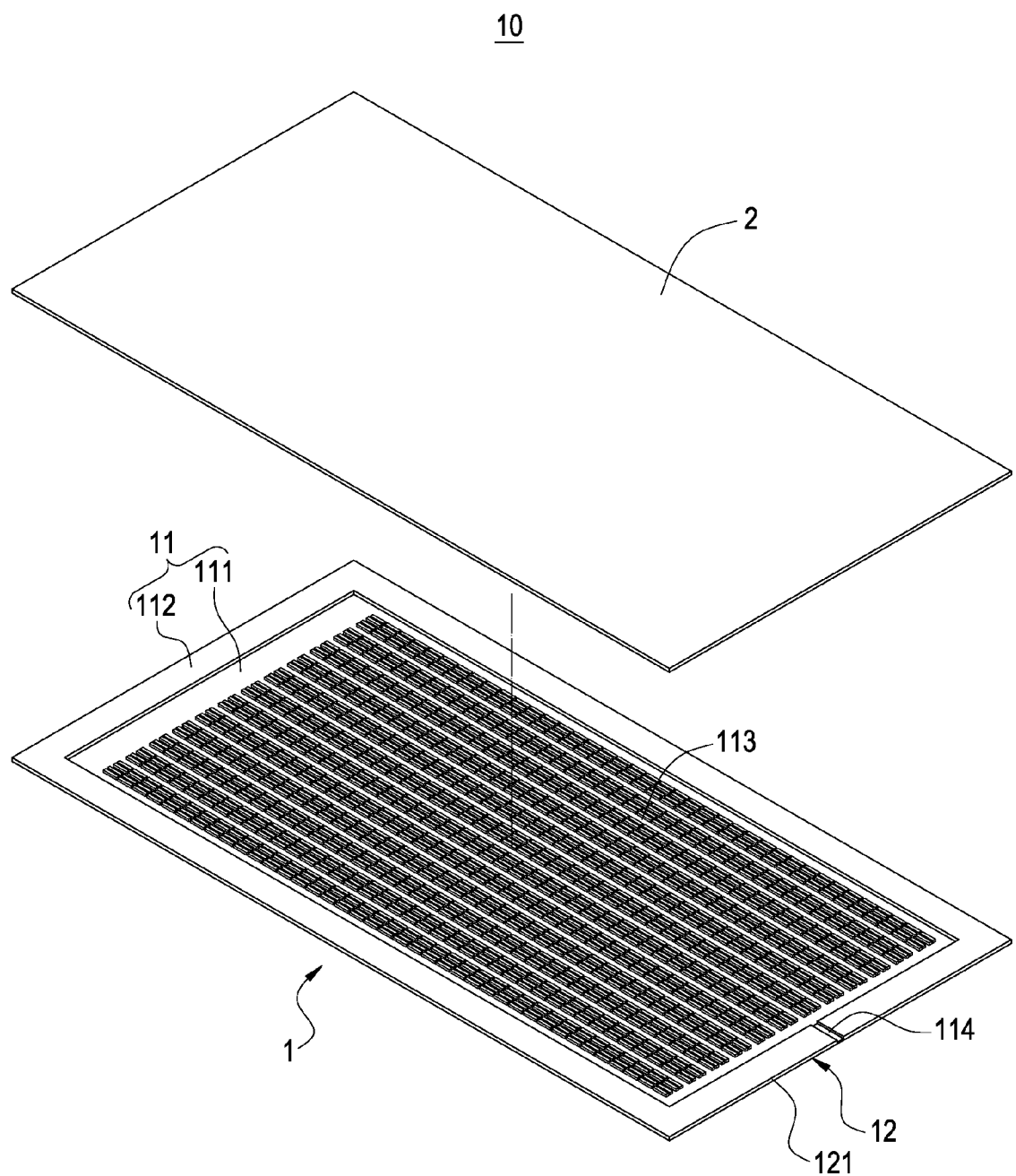
FIG. 2 is a schematic view showing an upper shell member being correspondingly engaged with an upper surface according to one preferred embodiment of the present invention.

As shown as a step b) disclosed in FIG. 1 and as shown in FIG. 2, the second step is to form a recess 114 in the outer zone 112, one end of the recess 114 is communicated with at least one of the capillary channels 113 and the other end thereof penetrates the planar surface 121.

As shown as a step c) disclosed in FIG. 1 and as shown from FIG. 3 to FIG. 6, the third step is to prepare an upper shell member 2, the upper shell member 2 is correspondingly engaged with the upper surface 11, and an engaging and sealing operation is processed to the edge of the lower shell member 1 and the edge of the upper shell member 2, thereby allowing a gas discharging hole 3 to be formed between the recess 114 and the upper shell member 2.

As shown as a step d) disclosed in FIG. 1, the fourth step is to prepare a working fluid, the working fluid is filled in the capillary channels 113 through the gas discharging hole 3 and a vacuuming operation is processed.

As shown as a step e) disclosed in FIG. 1 and as shown in FIG. 7, the fifth step is to process a sealing operation to the gas discharging hole 3, the sealing operation is performed through pressing the lower shell member 1 towards the recess 114 for being welded so as to form a sealed part 4, and the sealed part 4 is served to seal the gas discharging hole 3. Accordingly, with the step a) to the step e) disclosed above, a final product of the vapor chamber 10 provided by the present invention can be obtained.

As shown from FIG. 2 to FIG. 6, the lower shell member 1 is formed with the upper surface 11 and the outer peripheral wall 12, the outer peripheral wall 12 is formed with the planar surface 121, the upper surface 11 is divided into the inner zone 111 and the outer zone 112 annularly arranged at the outer periphery of the inner zone 111, the inner zone 111 is formed with the plural capillary channels 113 communicated with each other, the outer zone 112 is formed with the recess 114, and one end of the recess 114 is communicated with at least one of the capillary channels 113 and the other end thereof penetrates the planar surface 121. Wherein, each of the capillary channels 113 is composed of a sintered member, a metal net member, an etching groove or a combination of the above.

As shown from FIG. 2 to FIG. 6, the upper shell member 2 is correspondingly engaged with the upper surface 11 and mutually sealed with the lower shell member 1, and the gas discharging hole 3 is formed between the recess 114 and the upper shell member 2.

Figure 5:
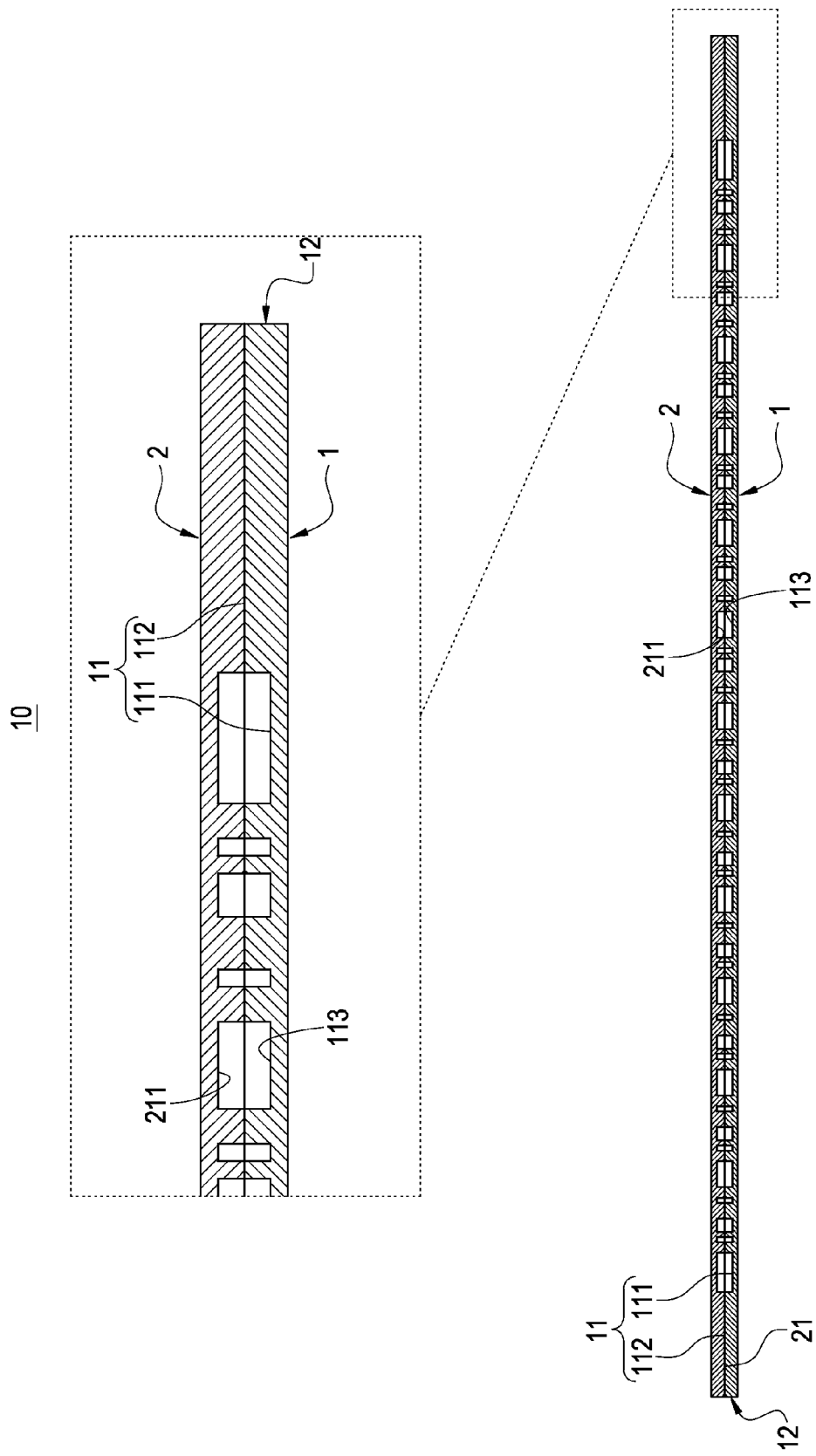
FIG. 5 is another cross sectional view showing the vapor chamber according to one preferred embodiment of the present invention.
Figure 8:
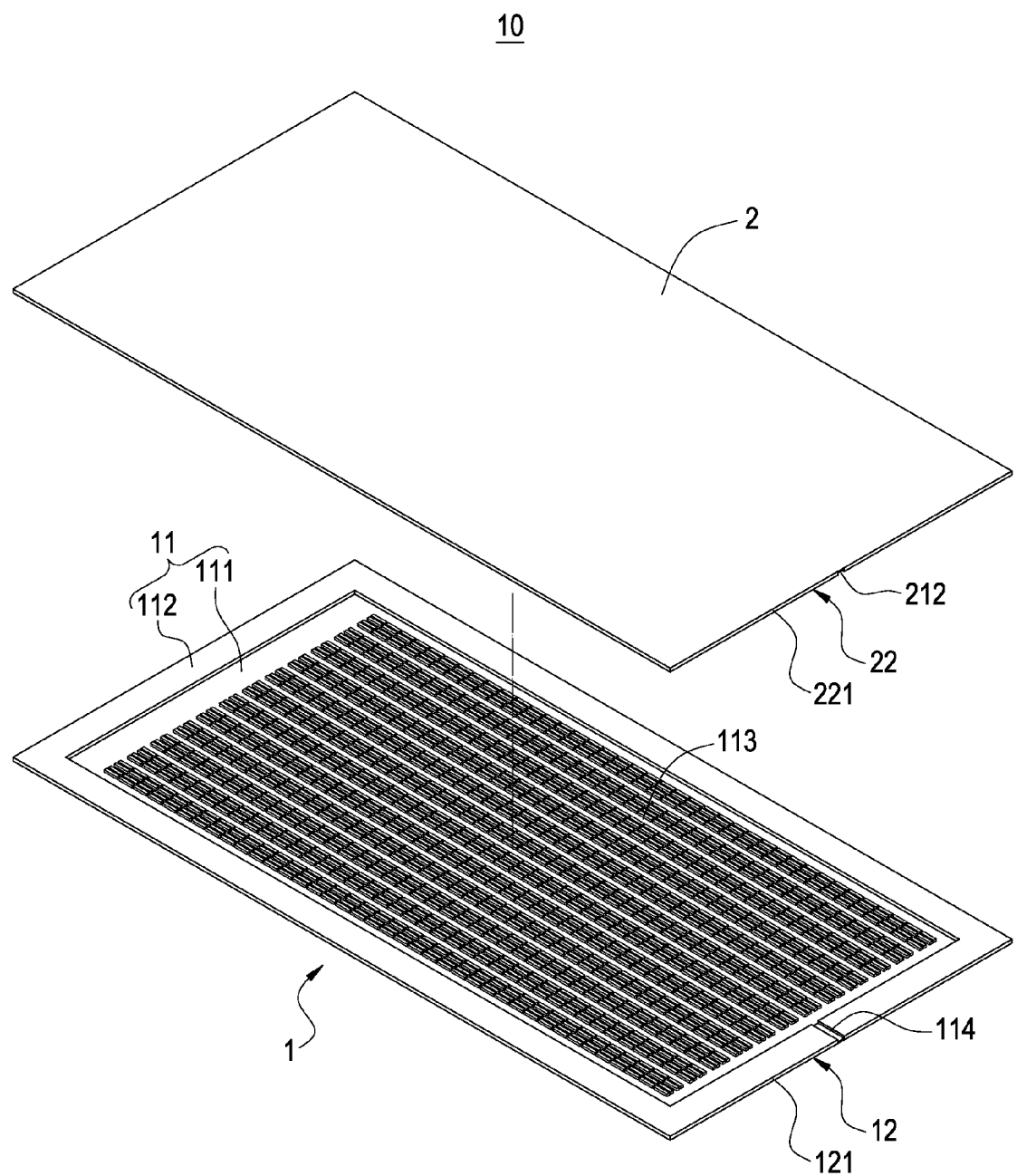
FIG. 8 is a perspective exploded view showing the vapor chamber according another preferred embodiment of the present invention.
Figure 9:
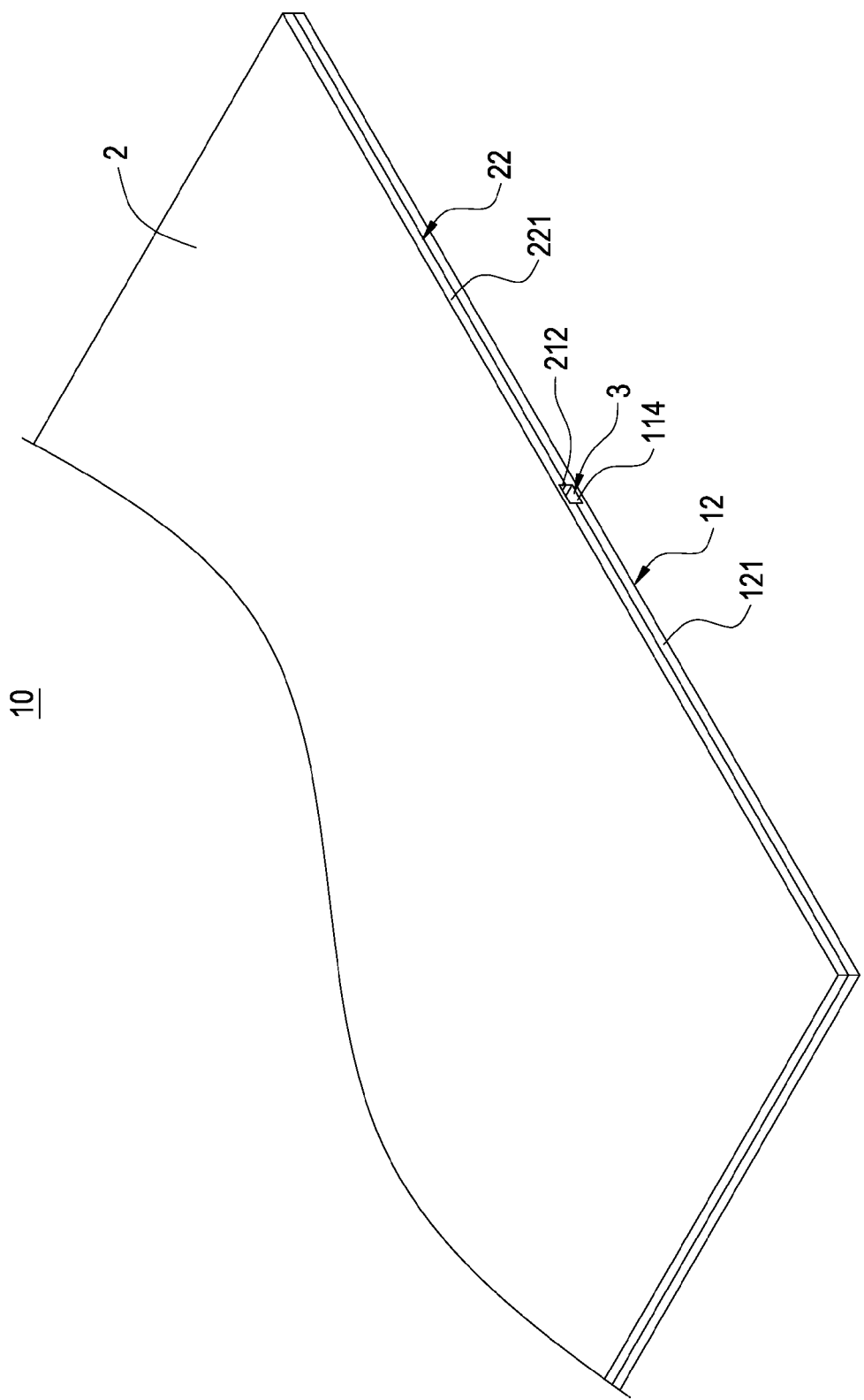
FIG. 9 is a perspective view showing the assembly of the vapor chamber according another preferred embodiment of the present invention.

In addition, the upper shell member 2 can be a plate or formed with a plurality of channels; as shown in FIG. 5 and FIG. 6, according to this embodiment, the upper shell member 2 is formed with a plurality of channels, however what shall be addressed is that the scope of the present invention is not limited to the above-mentioned arrangement. Details are provided as follows: the upper shell member 2 is formed with a lower surface 21, the lower surface 21 is mutually engaged and sealed with the outer zone 112, and the lower surface 21 is formed with a plurality of assisting channels 211 corresponding to the plural capillary channels 113. Wherein, each of the assisting channels 211 is composed of a sintered member, a metal net member, an etching groove or a combination of the above.

As shown in FIG. 7, the sealed part 4 for sealing the gas discharging hole 3 is further formed between the recess 114 and the lower shell member 1, the sealed part 4 is formed through pressing the lower shell member 1 towards the recess 114 for being welded, thereby allowing an inner wall of the lower shell member 1 and an inner wall of the recess 114 to be mutually combined, thus the sealed part 4 is enabled to seal the gas discharging hole 3.

Figure 3:
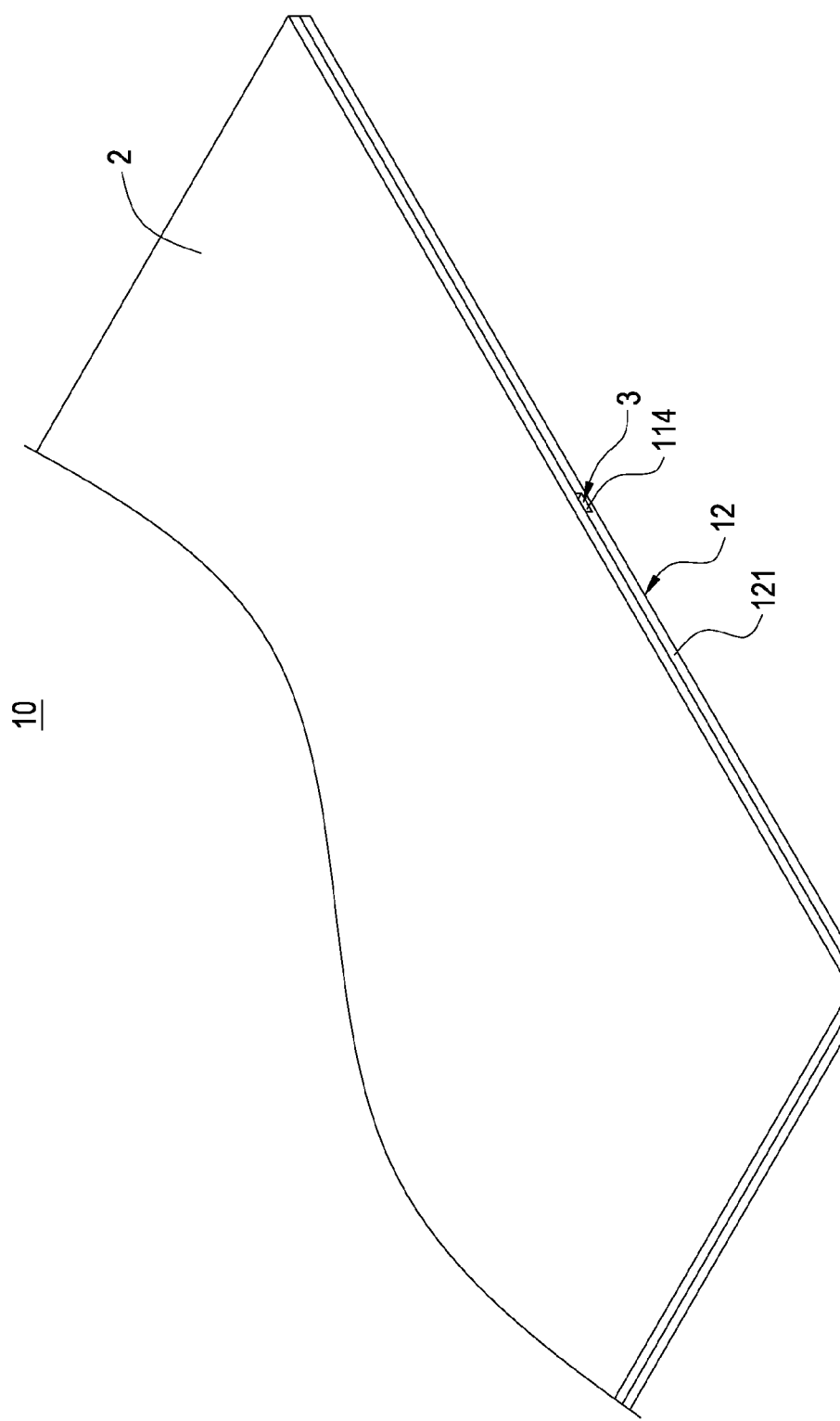
FIG. 3 is a schematic view showing an engaging and sealing operation being processed to the edge of a lower shell member and the edge of the upper shell member according to one preferred embodiment of the present invention.
Figure 4:
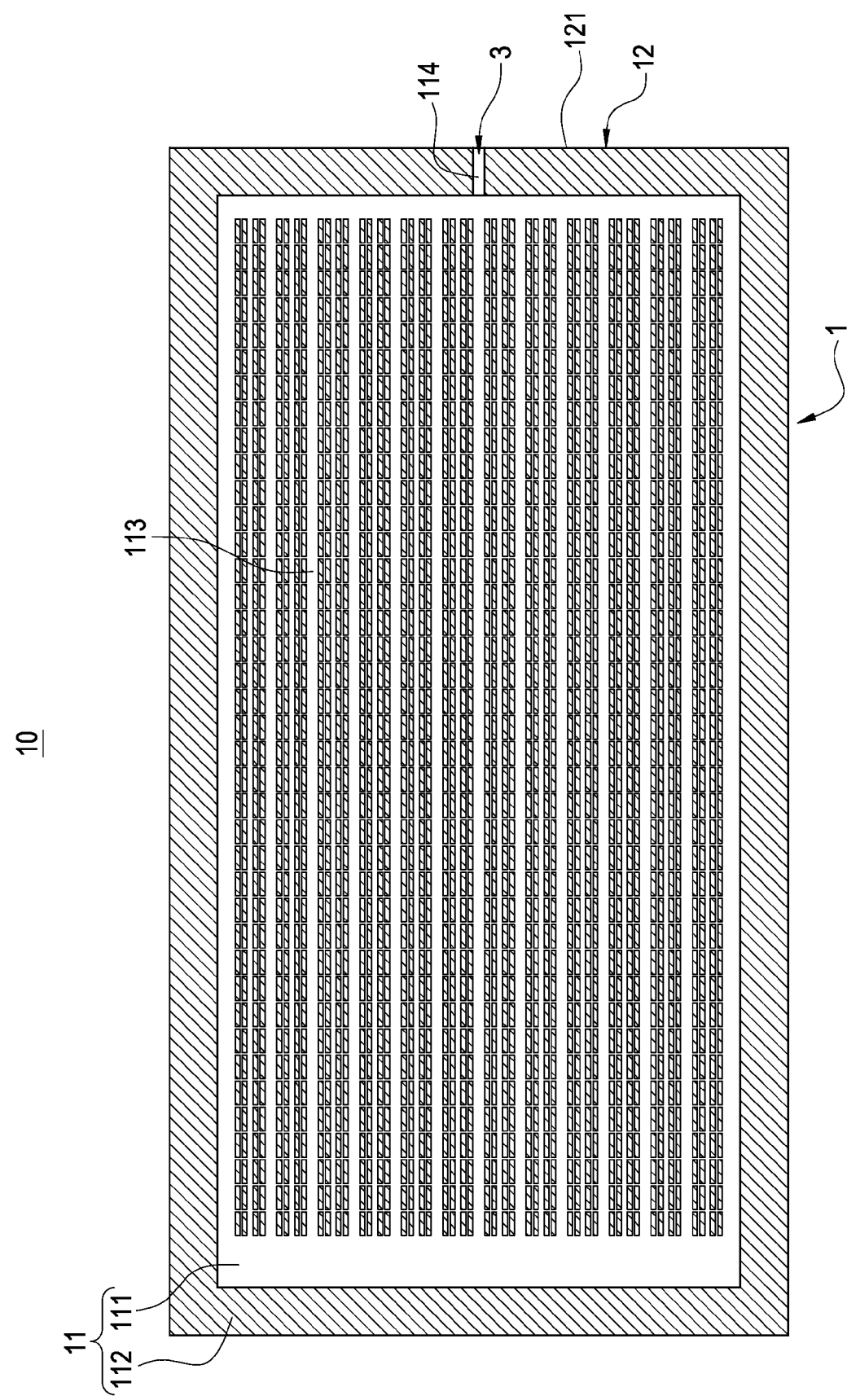
FIG. 4 is a cross sectional view showing the vapor chamber according to one preferred embodiment of the present invention.

As shown in FIG. 2, FIG. 3 and FIG. 5, the assembly and the operating status of the vapor chamber 10 provided by the present invention are disclosed as follows: the lower shell member 1 is formed with the upper surface 11 and the outer peripheral wall 12, the outer peripheral wall 12 is formed with the planar surface 121, the upper surface 11 is divided into the inner zone 111 and the outer zone 112 annularly arranged at the outer periphery of the inner zone 111, the inner zone 111 is formed with the plural capillary channels 113 communicated with each other, the outer zone 112 is formed with the recess 114, one end of the recess 114 is communicated with at least one of the capillary channels 113 and the other end thereof penetrates the planar surface 121; the upper shell member 2 is correspondingly engaged with the upper surface 11 and mutually sealed with the lower shell member 1, and the gas discharging hole 3 is formed between the recess 114 and the upper shell member 2. As such, the lower shell member 1 is formed with the recess 114, one end of the recess 114 is communicated with at least one of the capillary channels 113 and the other end thereof penetrates the planar surface 121, and the gas discharging hole 3 is formed between the recess 114 and the upper shell member 2; because the gas discharging hole 3 is inwardly formed on the planar surface 121 of the vapor chamber 10, a conventional gas discharging protrusion is not required on the vapor chamber 10, thus the vapor chamber 10 of the present invention is provided with advantages of small and thin in volume and compact in structure.

Please refer from FIG. 8 to FIG. 11, which provide another preferred embodiment for disclosing the vapor chamber 10 of the present invention, the embodiment disclosed from FIG. 8 to FIG. 11 is substantially the same as the embodiment disclosed from FIG. 2 to FIG. 7, and the difference between the embodiment disclosed from FIG. 8 to FIG. 11 and the embodiment disclosed from FIG. 2 to FIG. 7 is that the upper shell member 2 is formed with a concave groove 212.

Details are provided as follows: the upper shell member 2 is formed with an outer annular wall 22, the outer annular wall 22 is formed with a planar surface 221, the lower surface 21 is formed with a concave groove 212 corresponding to the recess 114, one end of the concave groove 212 is communicated with at least one of the assisting channels 211 and the other end thereof penetrates the planar surface 221, thereby allowing the gas discharging hole 3 to be formed by the recess 114 and the concave groove 212. Accordingly, the functions and effects achieved by the embodiment disclosed from FIG. 2 and FIG. 7 can also be provided.

In addition, a sealed part 4 for sealing the gas discharging hole 3 is further formed between the recess 114, the concave groove 212, the lower shell member 1 and the upper shell member 2, the sealed part 4 is formed through pressing the lower shell member 1 towards the recess 114 and pressing the upper shell member 2 towards the concave groove 212 for being welded, so the inner wall of the lower shell member 1 and the inner wall of the upper shell member 2 are enabled to be mutually combined, thereby allowing the sealed part 4 to achieve the effect of sealing the gas discharging hole 3.

Moreover, as shown in FIG. 7, the sealed part 14 is arranged at the opened end of the gas discharging hole 3, so in the embodiment disclosed from FIG. 2 to FIG. 7, the inner wall of the lower shell member 1 and the inner wall of the recess 14 are mutually combined for a certain distance from the opened end of the gas discharging hole 3 towards inward, and in the embodiment disclosed from FIG. 8 to FIG. 11, the inner wall of the lower shell member 1 and the inner wall of the upper shell member 2 are mutually combined for a certain distance from the opened end of the gas discharging hole 3 towards inward.

Or, as shown in FIG. 11, the sealed part 4 is arranged in the middle portion of the gas discharging hole 3, so according to the embodiment disclosed from FIG. 8 to FIG. 11, the inner wall of the lower shell member 1 and the inner wall of the upper shell ember 2 are only combined at the middle portion of the gas discharging hole 3; so it is known that if the sealed part 4 is arranged in the middle portion of the gas discharging hole 3, in the embodiment disclosed from FIG. 2 to FIG. 7, the inner wall of the lower shell member 1 and the inner wall of the recess 114 are only combined at the middle portion of the gas discharging hole 3.

Accordingly, the vapor chamber and the manufacturing method thereof provided by the present invention is novel and more practical in use comparing to prior art.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A vapor chamber having no gas discharging protrusion, including:
   a lower shell member, formed with an upper surface and an outer peripheral wall, wherein the outer peripheral wall is formed with a planar surface, the upper surface is divided into an inner zone and an outer zone annularly arranged at the outer periphery of the inner zone, the inner zone is formed with a plurality of capillary channels communicated with each other, the outer zone is formed with a recess, and one end of the recess is communicated with at least one of the capillary channels and the other end thereof penetrates the planar surface; and
   an upper shell member, correspondingly engaged with the upper surface and mutually sealed with the lower shell member, wherein a gas discharging hole is formed between the recess and the upper shell member,
   wherein a sealed part is further formed between the recess and the lower shell member for sealing the gas discharging hole.

2. The vapor chamber having no gas discharging protrusion according to claim 1, wherein the sealed part is formed through pressing the lower shell member towards the recess for being welded, and an inner wall of the lower shell member and an inner wall of the recess are mutually combined.

3. The vapor chamber having no gas discharging protrusion according to claim 2, wherein the sealed part is arranged at an opened end of the gas discharging hole or arranged in the middle portion of the gas discharging hole.

4. A vapor chamber having no gas discharging protrusion, including:
   a lower shell member, formed with an upper surface and an outer peripheral wall, wherein the outer peripheral wall is formed with a planar surface, the upper surface is divided into an inner zone and an outer zone annularly arranged at the outer periphery of the inner zone, the inner zone is formed with a plurality of capillary channels communicated with each other, the outer zone is formed with a recess, and one end of the recess is communicated with at least one of the capillary channels and the other end thereof penetrates the planar surface; and
   an upper shell member, correspondingly engaged with the upper surface and mutually sealed with the lower shell member, wherein a gas discharging hole is formed between the recess and the upper shell member,
   wherein the upper shell member is formed with a lower surface, the lower surface is mutually engaged and sealed with the outer zone, and the lower surface is formed with a plurality of assisting channels corresponding to the plural capillary channels;
   wherein the upper shell member is formed with an outer annular wall, the outer annular wall is formed with a planar surface, the lower surface is formed with a concave groove corresponding to the recess, one end of the concave groove is communicated with at least one of the assisting channels and the other end thereof penetrates the planar surface.

5. The vapor chamber having no gas discharging protrusion according to claim 4, wherein a sealed part is further formed between the recess, the concave groove, the lower shell member and the upper shell member for sealing the gas discharging hole.

6. The vapor chamber having no gas discharging protrusion according to claim 5, wherein the sealed part is formed through pressing the lower shell member towards the recess and pressing the upper shell member towards the concave groove for being welded, and an inner wall of the lower shell member and an inner wall of the upper shell member are mutually combined.

7. The vapor chamber having no gas discharging protrusion according to claim 6, wherein the sealed part is arranged at an opened end of the gas discharging hole or arranged in the middle portion of the gas discharging hole.

8. The vapor chamber having no gas discharging protrusion according to claim 4, wherein the capillary channels and the assisting channels are respectively composed of a sintered member, a metal net member, an etching groove or a combination of the above.

9. A manufacturing method of a vapor chamber having no gas discharging protrusion, including:
   step a) preparing a lower shell member, wherein the lower shell member is formed with an upper surface and an outer peripheral wall, the outer peripheral wall is formed with a planar surface, the upper surface is divided into an inner zone and an outer zone annularly arranged at the outer periphery of the inner zone, and the inner zone is formed with a plurality of capillary channels communicated with each other;

step b) forming a recess in the outer zone, wherein one end of the recess is communicated with at least one of the capillary channels and the other end thereof penetrates the planar surface;

step c) preparing an upper shell member, wherein the upper shell member is correspondingly engaged with the upper surface, and an engaging and sealing operation is processed to the edge of the lower shell member and the edge of the upper shell member, thereby allowing a gas discharging hole to be formed between the recess and the upper shell member;

step d) preparing a working fluid, wherein the working fluid is filled in the capillary channels through the gas discharging hole and a vacuuming operation is processed; and step e) processing a sealing operation to the gas discharging hole, wherein the sealing operation disclosed in the step e) is performed through pressing the lower shell member towards the recess for being welded thereby allowing an inner wall of the lower shell member and an inner wall of the recess to be mutually combined so as to form a sealed part, and the sealed part is served to seal the gas discharging hole.

10. The manufacturing method of a vapor chamber having no gas discharging protrusion according to claim 9, wherein the sealed part is arranged at an opened end of the gas discharging hole or arranged in the middle portion of the gas discharging hole.

11. The manufacturing method of a vapor chamber having no gas discharging protrusion according to claim 9, wherein the upper shell member disclosed in the step c) is formed with a lower surface, the lower surface is mutually engaged and sealed with the outer zone, and the lower surface is formed with a plurality of assisting channels corresponding to the plural capillary channels.

12. A manufacturing method of a vapor chamber having no gas discharging protrusion, including:

step a) preparing a lower shell member, wherein the lower shell member is formed with an upper surface and an outer peripheral wall, the outer peripheral wall is formed with a planar surface, the upper surface is divided into an inner zone and an outer zone annularly arranged at the outer periphery of the inner zone, and the inner zone is formed with a plurality of capillary channels communicated with each other;

step b) forming a recess in the outer zone, wherein one end of the recess is communicated with at least one of the capillary channels and the other end thereof penetrates the planar surface;

step c) preparing an upper shell member, wherein the upper shell member is correspondingly engaged with the upper surface, and an engaging and sealing operation is processed to the edge of the lower shell member and the edge of the upper shell member, thereby allowing a gas discharging hole to be formed between the recess and the upper shell member;

step d) preparing a working fluid, wherein the working fluid is filled in the capillary channels through the gas discharging hole and a vacuuming operation is processed; and step e) processing a sealing operation to the gas discharging hole, wherein the upper shell member is formed with an outer annular wall, the outer annular wall is formed with a planar surface, the lower surface is formed with a concave groove corresponding to the recess, one end of the concave groove is communicated with at least one of the assisting channels and the other end thereof penetrates the planar surface.

13. The manufacturing method of a vapor chamber having no gas discharging protrusion according to claim 12, wherein the sealing operation disclosed in the step e) is performed through pressing the lower shell member towards the recess and pressing the upper shell member towards the concave groove for being welded thereby allowing an inner wall of the lower shell member and an inner wall of the upper shell member to be mutually combined so as to form a sealed part, and the sealed part is served to seal the gas discharging hole.

14. The manufacturing method of a vapor chamber having no gas discharging protrusion according to claim 13, wherein the sealed part is arranged at an opened end of the gas discharging hole or arranged in the middle portion of the gas discharging hole.

15. The manufacturing method of a vapor chamber having no gas discharging protrusion according to claim 12, wherein the capillary channels and the assisting channels are respectively composed of a sintered member, a metal net member, an etching groove or a combination of the above.

* * * * *